US011882678B2

(12) United States Patent
Miyamura et al.

(10) Patent No.: US 11,882,678 B2
(45) Date of Patent: Jan. 23, 2024

(54) REDUNDANT ISOLATION OF RACK MANIFOLDS FOR DATACENTER COOLING SYSTEMS

(71) Applicant: Nvidia Corporation, Santa Clara, CA (US)

(72) Inventors: Harold Miyamura, San Jose, CA (US); Jeremy Rodriguez, Santa Cruz, CA (US); Alexander Ishii, Canaan, NH (US); Alex Naderi, San Jose, CA (US); Ali Heydari, Albany, CA (US)

(73) Assignee: Nvidia Corporation, Santa Clara, CA (US)

( * ) Notice: Subject to any disclaimer, the term of this patent is extended or adjusted under 35 U.S.C. 154(b) by 587 days.

(21) Appl. No.: 16/984,664

(22) Filed: Aug. 4, 2020

(65) Prior Publication Data

US 2022/0046828 A1 Feb. 10, 2022

(51) Int. Cl.
*H05K 7/20* (2006.01)

(52) U.S. Cl.
CPC ..... *H05K 7/20836* (2013.01); *H05K 7/20272* (2013.01); *H05K 7/20281* (2013.01); *H05K 7/20763* (2013.01)

(58) Field of Classification Search
CPC .......... H05K 7/20836; H05K 7/20272; H05K 7/20281; H05K 7/20763; H05K 7/20818; H05K 7/20781
See application file for complete search history.

(56) References Cited

U.S. PATENT DOCUMENTS

| 8,004,831 | B1 | 8/2011 | Carlson |
| 8,411,439 | B1* | 4/2013 | Carlson ............... H05K 7/2079 165/80.4 |
| 10,085,367 | B2 | 9/2018 | Chainer |
| 10,565,848 | B2* | 2/2020 | Davis ...................... G01M 3/16 |
| 2009/0262495 | A1 | 10/2009 | Neudorfer |
| 2012/0216894 | A1* | 8/2012 | Lomax ................. F16K 27/067 251/315.1 |
| 2016/0128238 | A1 | 5/2016 | Shedd |

OTHER PUBLICATIONS

International Search Report and Written Opinion issued in PCT Application No. PCT/US21/44156, dated Nov. 15, 2021.

* cited by examiner

*Primary Examiner* — Lionel Nouketcha
(74) *Attorney, Agent, or Firm* — Lowenstein Sandler LLP

(57) ABSTRACT

A redundancy shut-off system for a datacenter liquid cooling system is disclosed. The redundancy shut-off system has a first ball valve located above a datacenter platform and coupling between a row manifold of a secondary cooling loop and a rack manifold of a rack, where the first ball valve provides redundancy to a second ball valve located below the datacenter platform.

24 Claims, 6 Drawing Sheets

REDUNDANT ISOLATION OF RACK MANIFOLDS FOR DATACENTER COOLING SYSTEMS

FIELD

At least one embodiment pertains to a redundancy shut-off system for a datacenter liquid cooling system. In at least one embodiment, the redundancy shut-off system has a first ball valve located above a datacenter platform and coupling between a row manifold of a secondary cooling loop and a rack manifold, where the first ball valve provides redundancy to a second ball valve located below the datacenter platform.

BACKGROUND

Datacenter cooling systems use fans to circulate air through server components. Certain supercomputers or other high capacity computers may use water or other cooling systems than air cooling systems to draw heat away from the server components or racks of the datacenter to an area external to the datacenter. The cooling systems may include a chiller within the datacenter area that is external to the datacenter. The chiller may be a cooling tower or other external heat exchanger that receives heated coolant from the datacenter and disperses the heat by forced air or other means to the environment (or an external cooling medium) before the cooled coolant is recirculated back into the datacenter to exchange heat with a secondary cooling loop via a coolant distribution unit (CDU). In an example, the chiller and the cooling tower together form a chilling facility with pumps responsive to temperature measured by external devices applied to the datacenter. Some limitations in air cooling systems are that they might not draw sufficient heat to support effective or efficient cooling in datacenters and some limitations in liquid cooling systems are that they might be capable of significantly damaging server components or racks by electrical shorting, flooding, or other issues. The capacity of the datacenter, such as the number of power density components are limited in part due to ineffective or inefficient air cooling in datacenters. The above-referenced issues of a liquid cooling system, such as electrical conductivity, leaks and flooding, must be addressed prior to deployment of the liquid cooling system.

BRIEF DESCRIPTION OF THE DRAWINGS

Various embodiments in accordance with the present disclosure will be described with reference to the drawings, in which.

DETAILED DESCRIPTION

Figure 1:
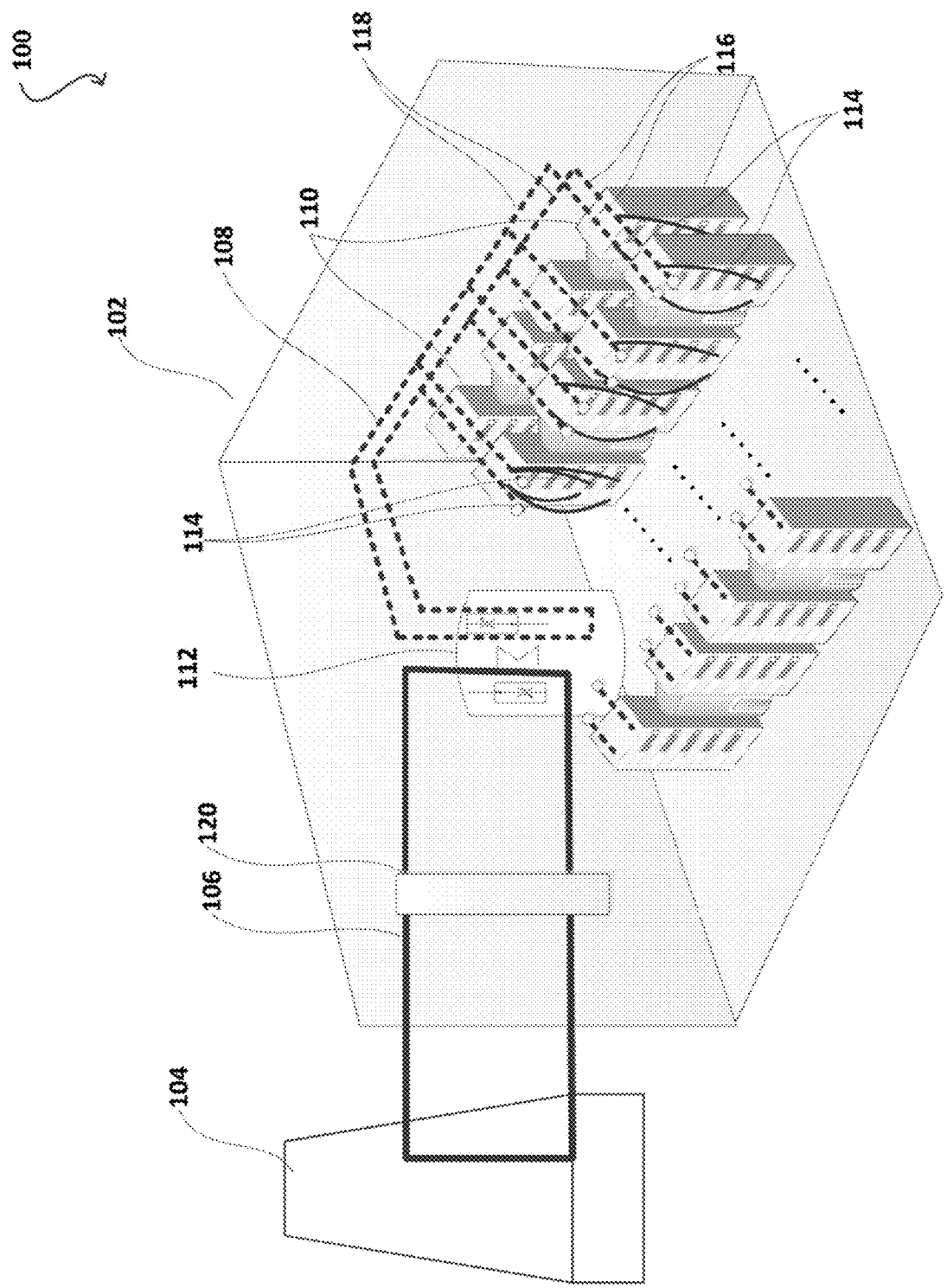
FIG. 1 is a block diagram of an example datacenter having a cooling system subject to improvements described in at least one embodiment.

Air cooling of high density servers is inefficient and ineffective in view of the high heat requirements caused by present day computing components. Further, air cooling is stressed and limited by its capacity to address emerging high density components generating high heat requirements. As such, the present disclosure seeks prospects in liquid coolants and associated systems for cooling high power computing components such as a graphics processing unit (GPU), a central processing unit (CPU), or switching components. These computing components are used in servers assembled in or associated with at least racks (such as information technology (IT) racks) in a datacenter. One issue addressed in the present disclosure is an inability to provide fast installations or fixes of any manifold issues (such as to removing affixing rack manifolds) because of a requirement to remove floor tiles to reach underlying shut-off systems.

For instance, a datacenter liquid cooling system is supported by a chiller plant or system that passes coolant through one or more cooling loops. The chiller plant or system is at least associated with a primary cooling loop (also referred to primary supply and return loop), which extracts heat from a secondary cooling loop that may be associated with one or more cooling loops within servers and/or racks. The secondary cooling loop extracts heat from components or the one or more cooling loops within the servers and/or racks, and exchanges the heat to the primary cooling loop. The liquid cooling system includes many intermediate features, such as pumps, coolant distribution units (CDUs), and heat exchangers. Manifolds receive liquid coolant and guide the liquid coolant to receiving features of the racks and/or servers.

Deployment of datacenter hardware for addressing requirements in the fields of artificial intelligence and machine learning includes installation of substantial computational capabilities having extremely dense server racks of GPU/CPU servers with very fast networking equipment. The density of the racks may leave little room for the cooling hardware or components, such as in-rack CDUs. Challenges may be presented in the form of accessibility of the cooling system to address and fix aspects, during on-time for the servers when the racks are functioning, without substantial downtime. Further, challenges may be also presented during cold-switching of component, such as cold swapping a field replaceable unit (FRU) or a CDU having pump failures. In addition, the challenges may be greatly amplified by the cooling requirements of in-demand datacenters that are deployed with the knowledge that they will be heavily used to perform computing-intensive operations that generate heat at capacity and that must be cooled on demand.

In at least one embodiment, a redundancy shut-off system for a datacenter liquid cooling system is disclosed. The redundancy shut-off system has a first ball valve that is located above a datacenter platform and that couples between a row manifold of a secondary cooling loop and a rack manifold of a rack. The first ball valve enables redundancy with respect to a second ball valve located below the datacenter platform. In at least one embodiment, the redundancy allows independent shut-off to a liquid flow within a liquid line having both the first ball valve and the second ball valve using the first ball valve independent of the second ball valve. Separately, the second ball valve may be used independently to also shut-off the liquid flow within the liquid line, but may require removal of floor tiles using appropriate equipment, which may delay the shut-off. The enabled use of the first and the second ball valves separately or independent of each other enables isolation of the liquid line at least at two points, which provides an isolation redundancy for rack manifolds of the datacenter cooling system.

In at least one embodiment, the redundancy shut-off system may include a leak tray to circumvent the first ball valve and to trap coolant in an event of failure of the first ball valve. In at least one embodiment, circumventing requires the leak tray to be around the first ball valve so trap within the leak tray any leak that may occur in a 360 degree field around the first ball valve. In at least one embodiment, the redundancy shut-off system may include a rack bracket to couple at least a portion of the first ball valve within the rack. In at least one embodiment, the at least one portion of the first ball valve may be held in place by rigidity in the rack manifold. In at least one embodiment, the redundancy shut-off system may include a leak sensor within the leak tray. The leak tray circumvents at least a portion of the first ball valve to trap coolant or other liquid in an event of failure of the first ball valve. The leak sensor may be adapted to communicate with a building management system (BMS) to enable shut-off of the second ball valve. In at least one embodiment, the redundancy shut-off system may include a first section and a second section for the first ball valve. The first section and the second section enable separate shut-offs on an entry side or an egress side of the first ball valve. In at least one embodiment, the redundancy shut-off system may include a holding area of the rack to couple the first ball valve within the rack and away from a server tray space to enable access to the server tray space. In at least one embodiment, the holding area is a horizontal bracket, such as a rack manifold mounting bracket. In at least one embodiment, the redundancy shut-off system may include through-holes in an underlying tile of the datacenter platform to enable a liquid line from the first ball valve to the second ball valve. In at least one embodiment, the redundancy shut-off system may include a rack bracket to maintain an alignment of at least a portion of the first ball valve along the direction of the rack manifold.

FIG. 1 is a block diagram of an example datacenter 100 having a cooling system subject to improvements described in at least one embodiment. The datacenter 100 may be one or more rooms 102 having racks 110 and auxiliary equipment to house one or more servers on one or more server trays. The datacenter 100 is supported by a cooling tower 104 located external to the datacenter 100. The cooling tower 104 dissipates heat from within the datacenter 100 by acting on a primary cooling loop 106. Further, a cooling distribution unit (CDU) 112 is used between the primary cooling loop 106 and a second or secondary cooling loop 108 to enable extraction of the heat from the second or secondary cooling loop 108 to the primary cooling loop 106. The secondary cooling loop 108 is able to access various plumbing all the way into the server tray as required, in an aspect. The loops 106, 108 are illustrated as line drawings, but a person of ordinary skill would recognize that one or more plumbing features may be used. In an instance, flexible polyvinyl chloride (PVC) pipes may be used along with associated plumbing to move the fluid along in each of the loops 106, 108. One or more coolant pumps, in at least one embodiment, may be used to maintain pressure differences within the loops 106, 108 to enable the movement of the coolant according to temperature sensors in various locations, including in the room, in one or more racks 110, and/or in server boxes or server trays within the racks 110.

In at least one embodiment, the coolant in the primary cooling loop 106 and in the secondary cooling loop 108 may be at least water and an additive, for instance, ethylene glycol or propylene glycol. In operation, each of the primary and the secondary cooling loops may have their respective coolants. In an aspect, the coolant in the secondary cooling loops may be proprietary to requirements of the components in the server tray or racks 110. The room or row-level CDU 112 is capable of sophisticated control of the coolants, independently or concurrently, in the loops 106, 108. For instance, the CDU may be adapted to control the flow rate so that the coolant(s) is appropriately distributed to extract heat generated within the racks 110. Further, flexible tubing 114 is provided from the secondary cooling loop 108 to enter each server tray and to provide coolant to the electrical and/or computing components. In the present disclosure, the electrical and/or computing components are used interchangeably to refer to the heat-generating components that benefit from the present datacenter cooling system. The tubing 118 that form part of the secondary cooling loop 108 may be referred to as room manifolds. Separately, the tubing 116 extending from tubing 118 may also be part of the secondary cooling loop 108 but may be referred to as row manifolds. The tubing 114 enters the racks as part of the secondary cooling loop 108, but may be referred to as rack cooling manifold. Further, the row manifolds 116 extend to all racks along a row in the datacenter 100. The plumbing of the secondary cooling loop 108, including the manifolds 118, 116, and 114 may be improved by at least one embodiment of the present disclosure. An optional chiller 120 may be provided in the primary cooling loop within datacenter 102 to support cooling before the cooling tower. To the extent additional loops exist in the primary control loop, a person of ordinary skill would recognize reading the present disclosure that the additional loops provide cooling external to the rack and external to the secondary cooling loop; and may be taken together with the primary cooling loop for this disclosure.

In at least one embodiment, in operation, heat generated within server trays of the racks 110 may be transferred to a coolant exiting the racks 110 via flexible tubing of the row manifold 114 of the second cooling loop 108. Pertinently, second coolant (in the secondary cooling loop 108) from the CDU 112, for cooling the racks 110, moves towards the racks 110. The second coolant from the CDU 112 passes from one side of the room manifold having tubing 118, to one side of the rack 110 via row manifold 116, and through one side of the server tray via tubing 114. Spent second coolant (also referred to as secondary return coolant or exiting second coolant) carries the heat from the computing components and exits out of another side of the server tray (such as, enter left side of the rack and exits right side of the rack for the server tray after looping through the server tray or through components on the server tray). The spent second coolant that exits the server tray or the rack 110 comes out of different side (such as, exiting side) of tubing 114 and moves to a parallel, but also exiting side of the row manifold 116. From the row manifold 116, the spent second coolant moves in a parallel portion of the room manifold 118 going in the opposite direction than the incoming second coolant (which may also be the renewed second coolant), and towards the CDU 112.

In at least one embodiment, the spent second coolant exchanges its heat with a primary coolant (supply coolant) in the primary cooling loop 106 via the CDU 112. The spent second coolant is renewed (such as, relatively cooled when compared to the temperature at the spent second coolant stage) and ready to be cycled back to through the second cooling loop 108 to the computing components. Various flow and temperature control features in the CDU 112 enable control of the heat exchanged from the spent second coolant or the flow of the second coolant in and out of the CDU 112. CDU 112 is also able to control a flow of the primary coolant in primary cooling loop 106. As such, while the CDU 112 designates flow of coolant, the flow itself may need controlling in the event of a failure in plumbing aspects of the datacenter liquid cooling systems. Where row manifolds are located under platforms hosting the racks, tiles of the platforms must be removed with special tools to enable access to the row manifolds and to associated valves. When a leak occurs, time lost in finding and accessing shut-off valves may aggravate the issue.

Figure 2:
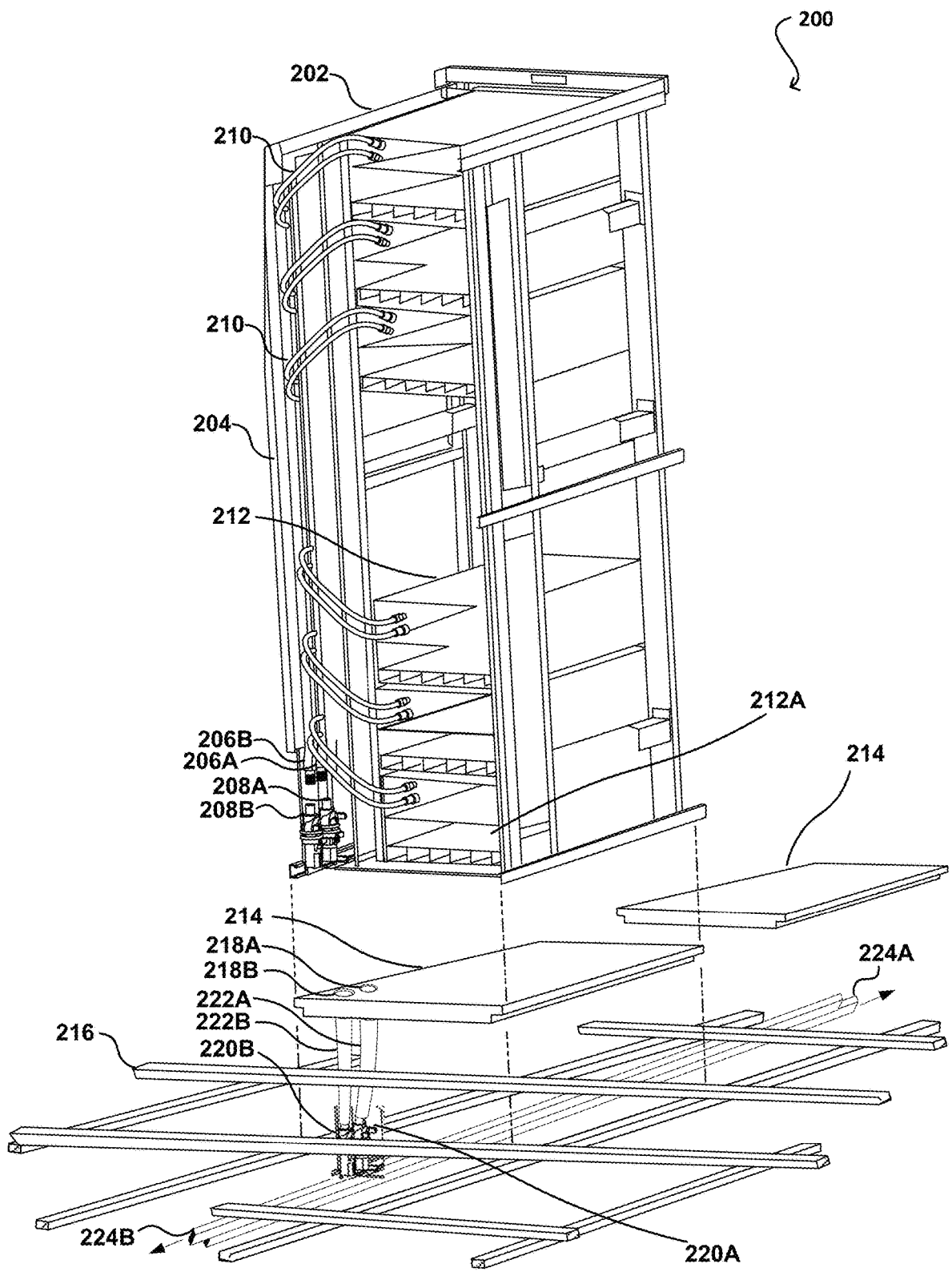
FIG. 2 is an example rack illustrating aspects of a redundancy shut-off system for a datacenter liquid cooling system, in accordance with at least one embodiment.

FIG. 2 is an example rack 202 illustrating aspects 200 of a redundancy shut-off system for a datacenter liquid cooling system, in accordance with at least one embodiment. In at least one embodiment, the datacenter liquid cooling system has a first ball valve 208A; 208B that is located above a datacenter platform formed of an interconnection of tiles 214 over support structures 216. In at least one embodiment, the datacenter platform may be a unibody structure and may not rely on tiles 214 or structures 216, but may still require specialized tools for removal of the unibody structure or any specific feature thereof. In at least one embodiment, there are at least two first ball valves 208A, 208B to address entry and egress of a cooling fluid, such as a coolant from row manifolds 224A, 224B below the datacenter platform.

In at least one embodiment, a second ball valve 220A; 220B is located below the datacenter platform. In at least one embodiment, there are at least two second ball valves 220A, 220B to address entry and egress of the cooling fluid, such as the coolant from row manifolds 224A, 224B below the datacenter platform. A liquid line (220A, 222A, 208A; 220B, 222B, 208B) has a liquid pipeline 222A; 22B that is coupled between a row manifold 224A; 224B of a secondary cooling loop and the rack manifold 206A; 206B associated with the rack 202. As such, the liquid line may include the valves and any intermediate adapters, while he liquid pipeline references pipes to contain the fluid from entry to egress. In at least one embodiment, there are at least two rack manifolds 206A, 206B to support incoming liquid and existing liquid. There are also at least two row manifolds 224A, 224B to support incoming liquid and exiting liquid. In at least one embodiment, there are at least two liquid lines having respective pipelines 222A, 222B, one for each of the first ball valves, each of the second ball valves, each of the rack manifolds, and each of the row manifolds.

In at least one embodiment, the first valves 208A, 208B address entry and egress of a cooling fluid, such as a coolant from the row manifolds 224A. 224B below the datacenter platform. As such, in at least one embodiment, a first liquid pipeline 222A is part of a first liquid line that includes a respective first ball valve 208A and a respective second ball valve 220A between a respective rack manifold 206A and a respective row manifold 224A to allow egress of a coolant from the server trays 212 and via entry and egress row pipelines 210. A second liquid pipeline 222B is part of a second liquid line that includes a different respective first ball valve 208B and a different respective second ball valve 220B between a different respective rack manifold 206*b* and a different respective row manifold 224B to allow entry of the coolant to the server trays 212 and via the entry and the egress row pipelines 210.

In at least one embodiment, the first ball valve 208A; 208B is adapted to shut-off to the liquid flow within the liquid line independent of the second ball valve 220A; 220B. This at least enables shut-off of liquid flow in a liquid line without a requirement to access (such as, to remove) the tiles 214 neighboring a tile underlying the rack 202. In at least one embodiment, the present disclosure, therefore, enables tool-less ball valves to be assembled and fitted within an allocated space of a rack of a datacenter liquid cooling system, above the datacenter platform. In at least one embodiment, the present disclosure enables tool-less service access to the secondary cooling loop (exemplified by the cooling lines having the first and the second ball valves) to control a shut-off valve. The first and the second ball valves may be gender neutral and may have positive shut-off interlock on both sides to enable manual liquid cutoff using balls within the valves on either sections of the ball valves, without coolant spillage. In at least one embodiment, the present disclosure enables a building management system (BMS) to include redundant control features enabled at least by the flow control features of the first and second ball valves provided in series within the secondary cooling loop for at least each rack.

In at least one embodiment, aspects 200 of the datacenter liquid cooling system include a rack bracket 204 to couple at least one portion of the first ball valve 208A; 208B within the rack 202. In at least one embodiment, the rack bracket 204 is a rack manifold mounting bracket. In at least one embodiment, metal strips or loops may be used to couple the at least one portion of the first ball valve 208A; 208B within the rack 202. In at least one embodiment, the aspect includes a holding area, such as within the bracket 204 of the rack 202, to provide the couple of the first ball valve within the rack. The holding area is illustrated as being away from a server tray space having server tray 212A to enable access to the server tray space. The present disclosure, therefore, enables a space-saving feature, in at least one embodiment, by providing access for extraction of a GPU server from a lowest U-space (presently illustrated with server tray or box 212A) within the rack 202. The U-space refers to a rack unit or measure within a rack 202 of available space for each server tray or box. In at least one embodiment, the U-space is a unit of measure defined as 1¾ inches or 44.45 mm of vertical space in the rack 202.

In at least one embodiment, a leak tray may be provided having one or more holes coinciding with holes 218A, 218B to allow for the pipelines 222A, 222B to reach the first ball valves 208A, 208B from below the datacenter platform having tiles 214. In at least one embodiment, the leak tray circumvents the first ball valves 208A, 208B to trap coolant in an event of failure of the first ball valves 208A; 208B. In at least one embodiment, the leak tray includes a leak sensor to provide leak detection that is communicated to the BMS. The information is used to cause shut-off of the first ball valves 208A, 208B, but can also be used to cause eventual shut-off of the second ball valves 220A, 220B. The urgency of a leak is first addressed by the first ball valves 208A, 208B, that may be followed up by addressing the second ball valves 220A, 220B, in at least one embodiment. In at least one embodiment, the leak sensor is within the leak tray and the leak tray circumvents at least a portion of the first ball valve to trap coolant in an event of failure of the first ball valve. The leak sensor may communicate, using wired or wireless protocols, with the BMS that may then cause automatic shut-off, if required of the first, and subsequently, the second ball valves.

In at least one embodiment, separately from the leak tray, the ball valves may have associated leak detection sensors or strips. In at least one embodiment, a leak detection sensor string may be associated with the second ball valves to provide leak detection for the secondary cooling loop under the datacenter platform. In at least one embodiment, leak detection sensors or strips may be provided in the center of a rack tray of a rack to collect any fluid leaking from inside the rack, such as by dripping onto the rack tray. Automatic shut-off may be enabled, in at least one embodiment, using input from any of the sensors or strips, by a motorized lever acting on a shut-off handle provided on each section of the ball valve.

Figure 3:
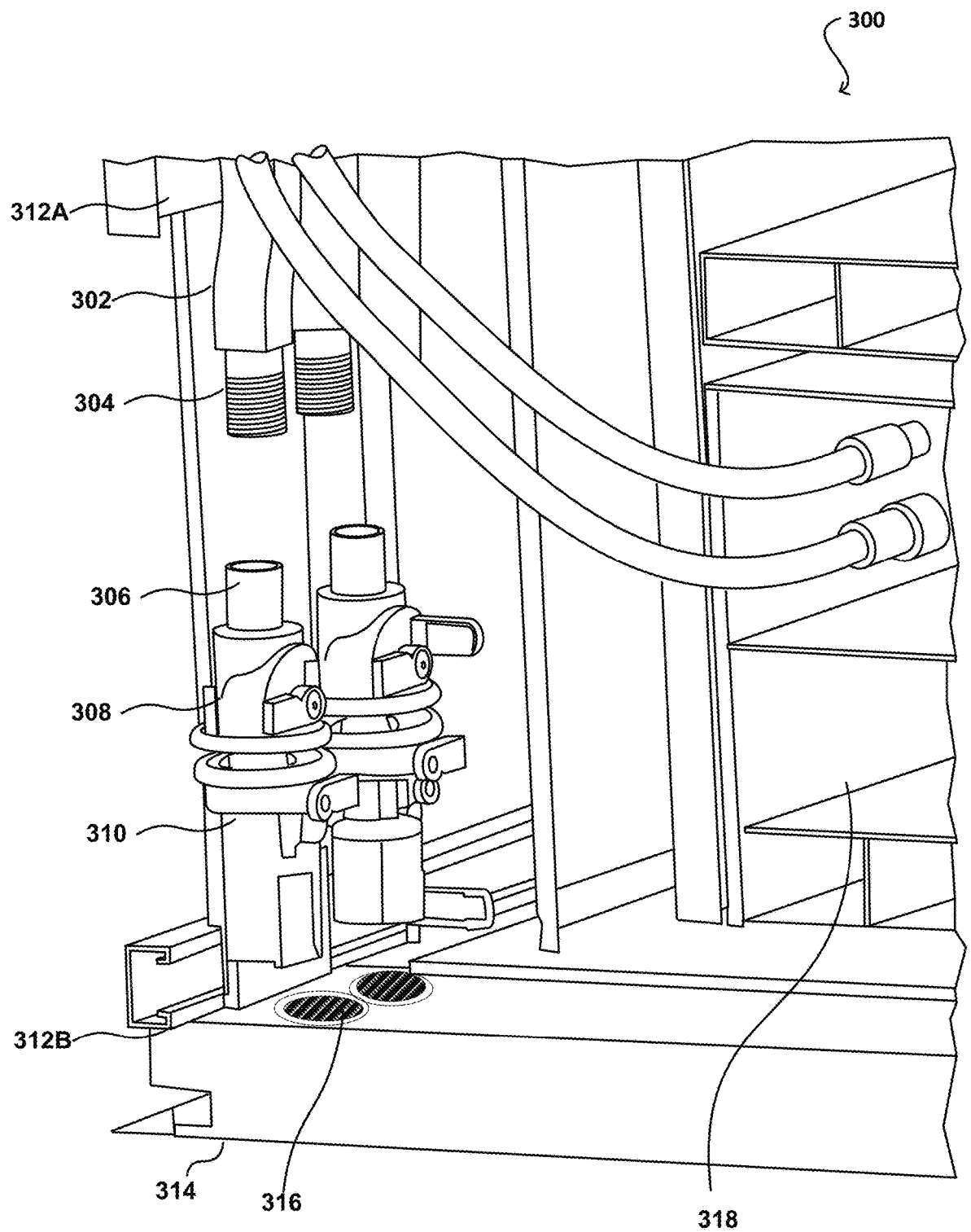
FIG. 3 is an example of aspects of a redundancy shut-off system for a datacenter liquid cooling system, in accordance with at least one embodiment.

FIG. 3 is an example of aspects 300 of a redundancy shut-off system for a datacenter liquid cooling system, in accordance with at least one embodiment. FIG. 3 details further each first ball valve 306, referenced in FIG. 2, in at least one embodiment. FIG. 3 also details the each row manifold 302 used for entry or egress of a liquid, such as a coolant, from the datacenter liquid cooling system. FIG. 3 also illustrates that each ball valve may have a first section 308 and a second section 310 to enable separate shut-offs on an entry side or an egress side of the first ball valve 306. Each of the row manifold 306 is coupled via an adapter 304 (or directly) to the each first ball valve 306. In at least one embodiment, the adapter is integrated or detectable. In at least one embodiment, through-holes 316 are provided in an underlying tile 314 of the datacenter platform to enable the liquid line from the first ball valve to reach or include the second ball valve. FIG. 3 also illustrates the previously-referenced space-saving feature, in at least one embodiment, by providing access for extraction of a GPU server from a lowest U-space (presently illustrated with server tray or box 318) within the rack. In at least one embodiment, a rack bracket 312A; 312B is provided to maintain an alignment of at least a portion of the first ball valve along the direction of the rack manifold 302. As illustrated, in at least one embodiment, the areas of one or more brackets 312A, 312B, allowing attachment of the first ball valve is referred to as the holding area(s).

Figure 4A:
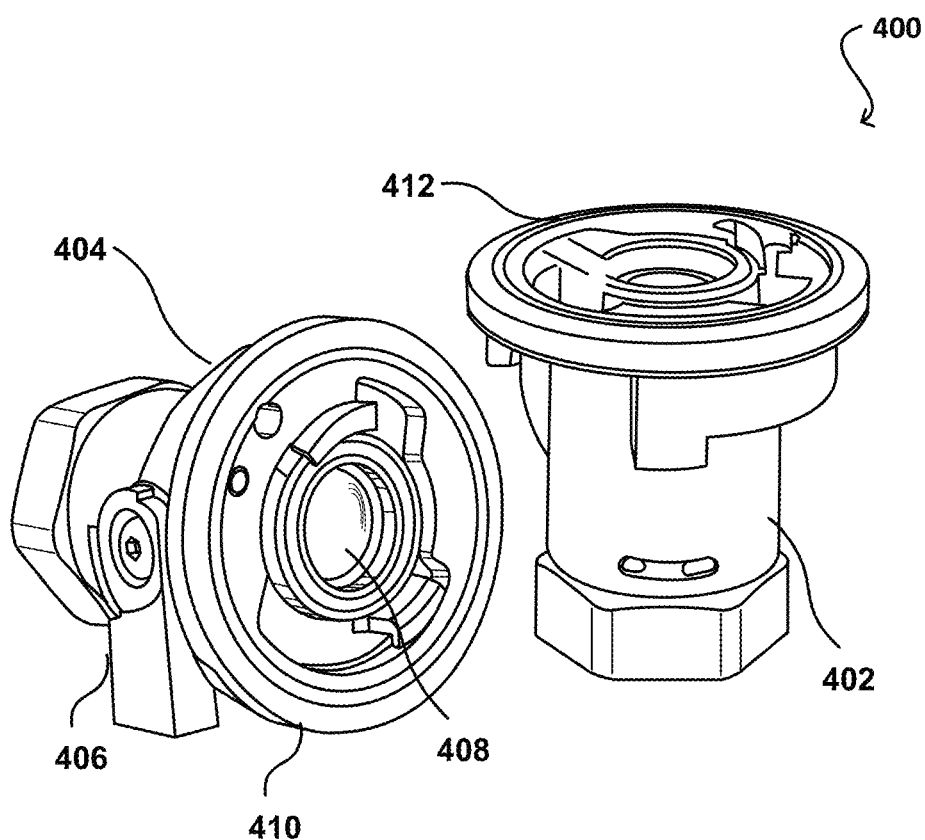
FIG. 4A illustrate features of a redundancy shut-off system for a datacenter liquid cooling system, in accordance with at least one embodiment.

FIG. 4A illustrate features 400 of a redundancy shut-off system for a datacenter liquid cooling system, in accordance with at least one embodiment. In at least one embodiment, the features 400 are sections of a ball valve, such as the first and the second ball valves that are referenced in FIGS. 2 and 3. In at least one embodiment, the ball valves include two sections 402, 404. Each of the sections include a respective ball 408 within a circumference hosting a sealing gasket on a face 410. A shut-off handle 406 is provided to shut-off each side of a liquid flow by at least an action of the ball 408 blocking the circumference of the ball valve. In at least one embodiment, the ball valve may be gender neutral and may have positive shut-off interlock on both sides to enable manual liquid cutoff using balls 408 within the valves on either sections of the ball valves, without coolant spillage. In at least one embodiment, the face 410 of the second section fits snugly on a face 412 of the first section 402. In at least one embodiment, gaskets associated with each face 410, 412 support a leak-proof fit.

Figure 4B:
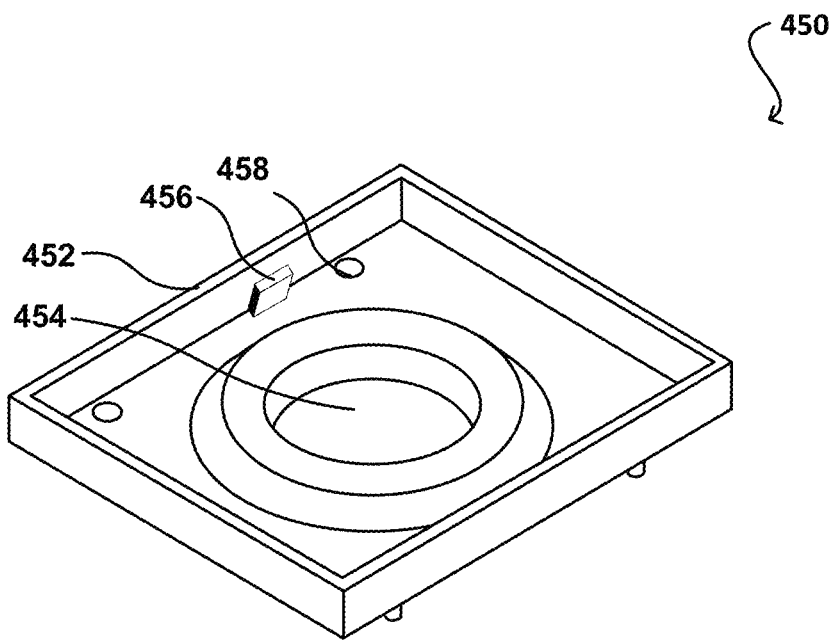
FIG. 4B illustrate further features of a redundancy shut-off system for a datacenter liquid cooling system, in accordance with at least one embodiment.

FIG. 4B illustrate further features 450 of a redundancy shut-off system for a datacenter liquid cooling system, in accordance with at least one embodiment. In at least one embodiment, the features 450 are of a leak tray that is referenced in FIGS. 2 and 3. In at least one embodiment, leak tray may have a circumventing area or hole 454 of 2.55" diameter to support a pipeline of 2.5" diameter. In at least one embodiment, the leak tray has welded seams 452 at four ends. In at least one embodiment, the leak tray may be shaped other than a rectangular or square shape that is illustrated in FIG. 4B. In at least one embodiment, the leak tray includes securement points 458 for welding, gluing, or fastening the leak tray to a top surface of a tile, such as tile 214 of FIG. 2. A leak sensor 456 is illustrated within the leak tray to communicate any information associated with a leak or potential leak (such as humidity information) to the BMS.

Figure 5:
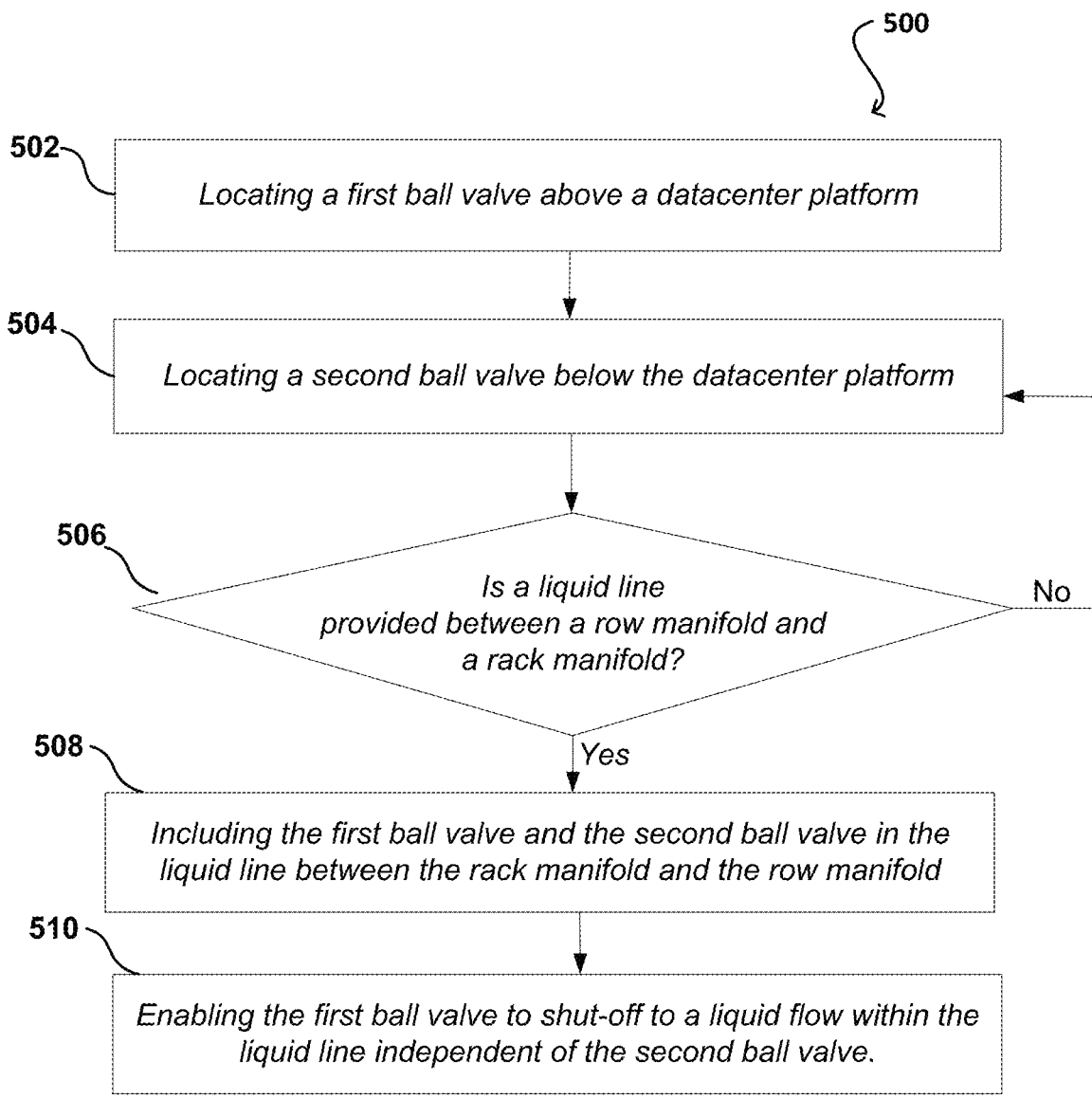
FIG. 5 is a process flow of steps available for a method of using or making illustrate features of a redundancy shut-off system for a datacenter liquid cooling system, such as a system in FIGS. 2-4, in accordance with at least one embodiment.

FIG. 5 is a process flow of steps available for a method 500 of using or making a redundancy shut-off system for a datacenter liquid cooling system, such as a system in FIGS. 2-4, in accordance with at least one embodiment. Step 502 of the method 500 locates a first ball valve above a datacenter platform. Step 504 locates a second ball valve below the datacenter platform. Step 506 determines if a liquid line is provided between a row manifold of a secondary cooling loop and a rack manifold of a rack. Step 508 includes the first ball valve and the second ball valve in the liquid line between the rack manifold and the row manifold. Step 510 enables the first ball valve to shut-off to a liquid flow within the liquid line independent of the second ball valve.

In at least one embodiment, step 508 includes a further step of providing a leak tray around the first ball valve to trap the liquid in an event of failure of the first ball valve. In at least one embodiment, step 502 includes coupling at least a portion of the first ball valve to a rack bracket within the rack. In at least one embodiment, step 504 includes providing a leak sensor within a leak tray with the leak tray having an area circumventing at least a portion of the first ball valve to trap coolant in an event of failure of the first ball valve. In at least one embodiment, step 504 may also include enabling the leak sensor to communicate with a building management system (BMS) to enable shut-off of the second ball valve. In at least one embodiment, step 502 or 510 may include enabling separate shut-offs on an entry side or an egress side of the first ball valve using separate ball valves in a first section and in a second section of the first ball valve.

In at least one embodiment, step 502 may include a sub-step of coupling the first ball valve to a holding area of the rack within the rack so that the first ball valve is away from a server tray space and access to the server tray space is enabled. In at least one embodiment, step 506 includes drilling through-holes in an underlying tile of the datacenter platform to enable the liquid line from the first ball valve to the second ball valve. In at least one embodiment, step 502 includes a sub-step of maintaining alignment of at least a portion of the first ball valve along the direction of the rack manifold using a rack bracket.

In at least one embodiment, the system herein provides a redundant valve kit that includes complete approved configuration options, including brackets, valves, leak sensors, leak trays, and other related hardware, to enable setup of a redundancy shut-off system for a datacenter liquid cooling system without the need to violate security requirements while moving in and out of the datacenter to retrieve specialized tools, hardware, and to address any removal and installation issues for a datacenter customer, who may be distinct from a solution provider for installing, repairing, and maintaining the racks within the datacenter.

Figure 6:
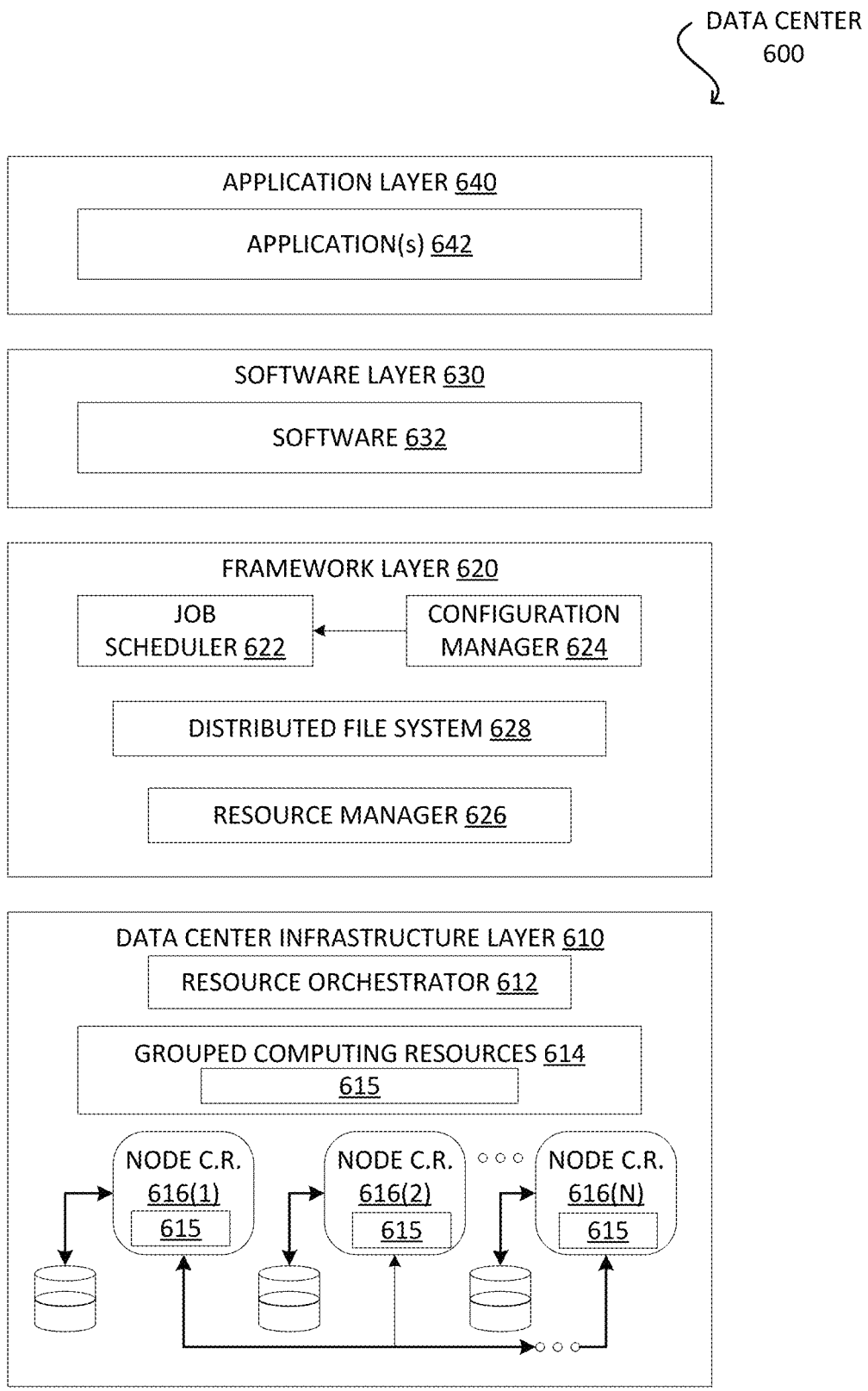
FIG. 6 illustrates an example datacenter, in which at least one embodiment from FIGS. 2-5 may be used.

FIG. 6 illustrates an example datacenter 600, in which at least one embodiment from FIGS. 2-5 may be used. In at least one embodiment, datacenter 600 includes a datacenter infrastructure layer 610, a framework layer 620, a software layer 630, and an application layer 640. In at least one embodiment, the infrastructure layer 610, the framework layer 620, the software layer 630, and the application layer 640 may be partly or fully provided via computing components on server trays located in racks 200 of the datacenter 100. This enables cooling systems of the present disclosure to direct cooling to certain ones of the computing components in an efficient and effective manner, and enables real-time replacement and installation of manifolds in dense datacenters. Further, aspects of the datacenter, including the datacenter infrastructure layer 610, the framework layer 620, the software layer 630, and the application layer 640, which may all benefit from the cooling system and method discussed with at least reference to FIGS. 2-5 above.

In at least one embodiment, as in FIG. 6, datacenter infrastructure layer 610 may include a resource orchestrator 612, grouped computing resources 614, and node computing resources ("node C.R.s") 616(1)-616(N), where "N" represents any whole, positive integer. In at least one embodiment, node C.R.s 616(1)-616(N) may include, but are not limited to, any number of central processing units ("CPUs") or other processors (including accelerators, field programmable gate arrays (FPGAs), graphics processors, etc.), memory devices (e.g., dynamic read-only memory), storage devices (e.g., solid state or disk drives), network input/output ("NW I/O") devices, network switches, virtual machines ("VMs"), power modules, and cooling modules, etc. In at least one embodiment, one or more node C.R.s from among node C.R.s 616(1)-616(N) may be a server having one or more of above-mentioned computing resources.

In at least one embodiment, grouped computing resources 614 may include separate groupings of node C.R.s housed within one or more racks (not shown), or many racks housed in datacenters at various geographical locations (also not shown). Separate groupings of node C.R.s within grouped computing resources 614 may include grouped compute, network, memory or storage resources that may be configured or allocated to support one or more workloads. In at least one embodiment, several node C.R.s including CPUs or processors may grouped within one or more racks to provide compute resources to support one or more workloads. In at least one embodiment, one or more racks may also include any number of power modules, cooling modules, and network switches, in any combination.

In at least one embodiment, resource orchestrator 612 may configure or otherwise control one or more node C.R.s 616(1)-616(N) and/or grouped computing resources 614. In at least one embodiment, resource orchestrator 612 may include a software design infrastructure ("SDI") management entity for datacenter 600. In at least one embodiment, resource orchestrator may include hardware, software or some combination thereof.

In at least one embodiment, as shown in FIG. 6, framework layer 620 includes a job scheduler 622, a configuration manager 624, a resource manager 626 and a distributed file system 628. In at least one embodiment, framework layer 620 may include a framework to support software 632 of software layer 630 and/or one or more application(s) 642 of application layer 640. In at least one embodiment, software 632 or application(s) 642 may respectively include web-based service software or applications, such as those provided by Amazon Web Services, Google Cloud and Microsoft Azure. In at least one embodiment, framework layer 620 may be, but is not limited to, a type of free and open-source software web application framework such as Apache Spark™ (hereinafter "Spark") that may utilize distributed file system 628 for large-scale data processing (e.g., "big data"). In at least one embodiment, job scheduler 622 may include a Spark driver to facilitate scheduling of workloads supported by various layers of datacenter 600. In at least one embodiment, configuration manager 624 may be capable of configuring different layers such as software layer 630 and framework layer 620 including Spark and distributed file system 628 for supporting large-scale data processing. In at least one embodiment, resource manager 626 may be capable of managing clustered or grouped computing resources mapped to or allocated for support of distributed file system 628 and job scheduler 622. In at least one embodiment, clustered or grouped computing resources may include grouped computing resource 614 at datacenter infrastructure layer 610. In at least one embodiment, resource manager 626 may coordinate with resource orchestrator 612 to manage these mapped or allocated computing resources.

In at least one embodiment, software 632 included in software layer 630 may include software used by at least portions of node C.R.s 616(1)-616(N), grouped computing resources 614, and/or distributed file system 628 of framework layer 620. One or more types of software may include, but are not limited to, Internet web page search software, e-mail virus scan software, database software, and streaming video content software.

In at least one embodiment, application(s) 642 included in application layer 640 may include one or more types of applications used by at least portions of node C.R.s 616(1)-616(N), grouped computing resources 614, and/or distributed file system 628 of framework layer 620. One or more types of applications may include, but are not limited to, any number of a genomics application, a cognitive compute, and a machine learning application, including training or inferencing software, machine learning framework software (e.g., PyTorch, TensorFlow, Caffe, etc.) or other machine learning applications used in conjunction with one or more embodiments.

In at least one embodiment, any of configuration manager 624, resource manager 626, and resource orchestrator 612 may implement any number and type of self-modifying actions based on any amount and type of data acquired in any technically feasible fashion. In at least one embodiment, self-modifying actions may relieve a datacenter operator of datacenter 600 from making possibly bad configuration decisions and possibly avoiding underutilized and/or poor performing portions of a datacenter.

In at least one embodiment, datacenter 600 may include tools, services, software or other resources to train one or more machine learning models or predict or infer information using one or more machine learning models according to one or more embodiments described herein. In at least one embodiment, in at least one embodiment, a machine learning model may be trained by calculating weight parameters according to a neural network architecture using software and computing resources described above with respect to datacenter 600. In at least one embodiment, trained machine learning models corresponding to one or more neural networks may be used to infer or predict information using resources described above with respect to datacenter 600 by using weight parameters calculated through one or more training techniques described herein. As previously discussed, deep learning techniques may be used to support intelligent control of the flow controllers in the refrigerant-assisted cooling by monitoring area temperatures of the datacenter. Deep learning may be advanced using any appropriate learning network and the computing capabilities of the datacenter 600. As such, a deep neural network (DNN), a recurrent neural network (RNN) or a convolutional neural network (CNN) may be supported either simultaneously or concurrently using the hardware in the datacenter. Once a network is trained and successfully evaluated to recognize data within a subset or a slice, for instance, the trained network can provide similar representative data for using with the collected data. These features may be used to assist the BMS control the motorized levers to shut-off appropriate ball valves within a rack.

In at least one embodiment, datacenter 600 may use CPUs, application-specific integrated circuits (ASICs), GPUs, FPGAs, or other hardware to perform training and/or inferencing using above-described resources. Moreover, one or more software and/or hardware resources described above may be configured as a service to allow users to train or performing inferencing of information, such as pressure, flow rates, temperature, and location information, or other artificial intelligence services Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit disclosure to specific form or forms disclosed, but on contrary, intention is to cover all modifications, alternative constructions, and equivalents falling within spirit and scope of disclosure, as defined in appended claims.

Use of terms "a" and "an" and "the" and similar referents in context of describing disclosed embodiments (especially in context of following claims) are to be construed to cover both singular and plural, unless otherwise indicated herein or clearly contradicted by context, and not as a definition of a term. Terms "including," "having," "including," and "containing" are to be construed as open-ended terms (meaning "including, but not limited to,") unless otherwise noted. Term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within range, unless otherwise indicated herein and each separate value is incorporated into specification as if it were individually recited herein. Use of a set (e.g., a set of items) or subset, unless otherwise noted or contradicted by context, is to be construed as a nonempty collection including one or more members. Further, unless otherwise noted or contradicted by context, a subset of a corresponding set does not necessarily denote a proper subset of corresponding set, but subset and corresponding set may be equal.

Conjunctive language, such as phrases of form "at least one of A, B, and C," or "at least one of A, B and C," unless specifically stated otherwise or otherwise clearly contradicted by context, is otherwise understood with context as used in general to present that an item, term, etc., may be either A or B or C, or any nonempty subset of set of A and B and C. For instance, in illustrative example of a set having three members, conjunctive phrases "at least one of A, B, and C" and "at least one of A, B and C" refer to any of following sets: {A}, {B}, {C}, {A, B}, {A, C}, {B, C}, {A, B, C}. Thus, such conjunctive language may not be intended to imply that certain embodiments require at least one of A, at least one of B, and at least one of C each to be present. In addition, unless otherwise noted or contradicted by context, a plurality indicates a state of being plural (e.g., a plurality of items indicates multiple items). A plurality is at least two items, but can be more when so indicated either explicitly or by context. Further, unless stated otherwise or otherwise clear from context, based on means based at least in part on and not based solely on.

Use of any and all examples, or exemplary language (e.g., "such as") provided herein, is intended merely to better illuminate embodiments of disclosure and does not pose a limitation on scope of disclosure unless otherwise claimed. No language in specification should be construed as indicating any non-claimed element as essential to practice of disclosure.

All references, including publications, patent applications, and patents, cited herein are hereby incorporated by reference to same extent as if each reference were individually and specifically indicated to be incorporated by reference and were set forth in its entirety herein.

In description and claims, terms "coupled" and "connected," along with their derivatives, may be used. It should be understood that these terms may be not intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification, references to processing, computing, calculating, determining, or the like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

Although discussion above sets forth example implementations of described techniques, other architectures may be used to implement described functionality, and are intended to be within scope of this disclosure. Furthermore, although specific distributions of responsibilities are defined above for purposes of discussion, various functions and responsibilities might be distributed and divided in different ways, depending on circumstances.

Furthermore, although subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A redundancy shut-off system for a datacenter liquid cooling system, the redundancy shut-off system comprising a first shut-off ball valve located above a datacenter platform, a second shut-off ball valve being located below the datacenter platform, the first shut-off ball valve and the second shut-off ball valve being fluidly coupled between a row manifold of a cooling loop and a rack manifold of a rack.

2. The redundancy shut-off system of claim 1, further comprising:
   a leak tray to circumvent the first shut-off ball valve and to trap coolant in an event of failure of the first shut-off ball valve.

3. The redundancy shut-off system of claim 1, further comprising:

a rack bracket to align at least a portion of the first shut-off ball valve within the rack.

4. The redundancy shut-off system of claim 1, further comprising:
a leak sensor within a leak tray, the leak tray to circumvent at least a portion of the first shut-off ball valve and to trap coolant in an event of failure of the first shut-off ball valve, the leak sensor to enable shut-off of the second shut-off ball valve.

5. The redundancy shut-off system of claim 1, further comprising:
a first section and a second section of the first shut-off ball valve to enable separate shut-offs on an entry side or an egress side of the first shut-off ball valve.

6. The redundancy shut-off system of claim 1, further comprising:
a holding area of the rack to align the first shut-off ball valve within the rack and away from a server tray space to enable access to the server tray space.

7. The redundancy shut-off system of claim 1, further comprising: through-holes in an underlying tile of the datacenter platform to enable a liquid line from the first shut-off ball valve to the second shut-off ball valve.

8. The redundancy shut-off system of claim 1, further comprising:
a rack bracket to maintain an alignment of at least a portion of the first shut-off ball valve along a direction of the rack manifold.

9. A datacenter liquid cooling system comprising:
a first shut-off ball valve located above a datacenter platform;
a second shut-off ball valve located below the datacenter platform; and
a liquid line to be coupled between a row manifold of a cooling loop and a rack manifold of a rack, the first shut-off ball valve and the second shut-off ball valve being disposed on the liquid line between the rack manifold and the row manifold, the first shut-off ball valve to shut-off to a liquid flow within the liquid line independent of the second shut-off ball valve.

10. The datacenter liquid cooling system of claim 9, further comprising:
a leak tray to circumvent the first shut-off ball valve and to trap coolant in an event of failure of the first shut-off ball valve.

11. The datacenter liquid cooling system of claim 9, further comprising:
a rack bracket to couple at least a portion of the first shut-off ball valve within the rack.

12. The datacenter liquid cooling system of claim 9, further comprising:
a leak sensor within a leak tray, the leak tray to circumvent at least a portion of the first shut-off ball valve and to trap coolant in an event of failure of the first shut-off ball valve, the leak sensor to enable shut-off of the second shut-off ball valve.

13. The datacenter liquid cooling system of claim 9, further comprising:
a first section and a second section of the first shut-off ball valve to enable separate shut-offs on an entry side or an egress side of the first shut-off ball valve.

14. The datacenter liquid cooling system of claim 9, further comprising:
a holding area of the rack to couple the first shut-off ball valve within the rack and away from a server tray space to enable access to the server tray space.

15. The datacenter liquid cooling system of claim 9, further comprising: through-holes in an underlying tile of the datacenter platform to enable the liquid line from the first shut-off ball valve to the second shut-off ball valve.

16. The datacenter liquid cooling system of claim 9, further comprising:
a rack bracket to maintain an alignment of at least a portion of the first shut-off ball valve along a direction of the rack manifold.

17. A method for redundancy in datacenter liquid cooling system, the method comprising:
locating a first shut-off ball valve above a datacenter platform;
locating a second shut-off ball valve below the datacenter platform; and
coupling a liquid line between a row manifold of a cooling loop and a rack manifold of a rack, the first shut-off ball valve and the second shut-off ball valve being disposed on the liquid line between the rack manifold and the row manifold, the first shut-off ball valve to shut-off to a liquid flow within the liquid line independent of the second shut-off ball valve.

18. The method of claim 17, further comprising:
providing a leak tray around the first shut-off ball valve, the leak tray to trap coolant in an event of failure of the first shut-off ball valve.

19. The method of claim 17, further comprising:
coupling at least a portion of the first shut-off ball valve to a rack bracket within the rack.

20. The method of claim 17, further comprising:
providing a leak sensor within a leak tray, the leak tray to circumvent at least a portion of the first shut-off ball valve and to trap coolant in an event of failure of the first shut-off ball valve; and
enabling the leak sensor to enable shut-off of the second shut-off ball valve.

21. The method of claim 17, further comprising:
enabling separate shut-offs on an entry side or an egress side of the first shut-off ball valve using separate ball valves in a first section and in a second section of the first shut-off ball valve.

22. The method of claim 17, further comprising:
coupling the first shut-off ball valve to a holding area of the rack within the rack so that the first shut-off ball valve is away from a server tray space and access to the server tray space is enabled.

23. The method of claim 17, further comprising:
drilling through-holes in an underlying tile of the datacenter platform to enable the liquid line from the first shut-off ball valve to the second shut-off ball valve.

24. The method of claim 17,
further comprising: maintaining alignment of at least a portion of the first shut-off ball valve along a direction of the rack manifold using a rack bracket.

\* \* \* \* \*